Figure 1:
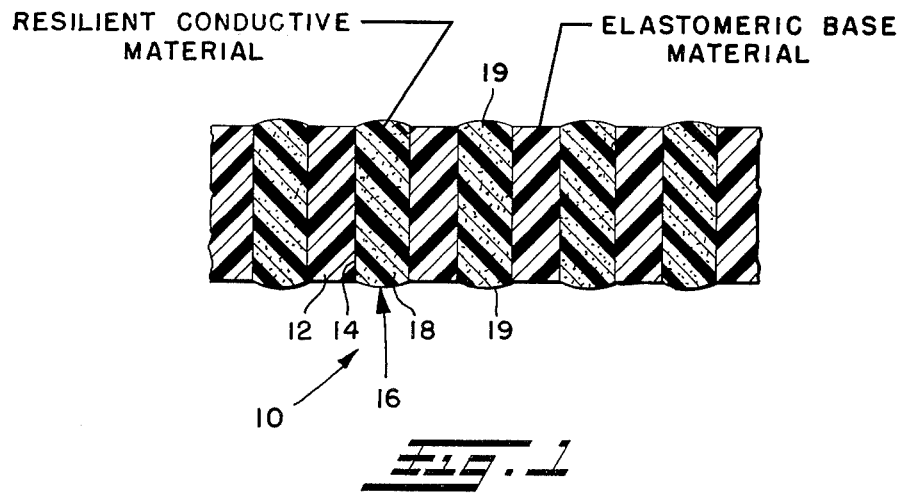

United States Patent [19]

Ponn

[11] 4,008,300
[45] Feb. 15, 1977

[54] MULTI-CONDUCTOR ELEMENT AND METHOD OF MAKING SAME

[75] Inventor: Timothy R. Ponn, Cleveland, Ohio

[73] Assignee: A & P Products Incorporated, Painesville, Ohio

[22] Filed: Oct. 15, 1974

[21] Appl. No.: 514,572

[52] U.S. Cl. .................... 264/104; 29/628; 264/25; 264/154; 264/156; 264/266; 264/291; 339/17 R; 339/61 M

[51] Int. Cl.² ............... H01R 13/24; H05K 1/04

[58] Field of Search ............ 264/25, 104, 154, 156, 264/265, 266, 272, 273, 291, 292; 29/624, 625, 628; 339/17 A, 17 B, 17 R, 59 R, 61 M

[56] References Cited

UNITED STATES PATENTS

| | | | |
|---|---|---|---|
| 2,651,833 | 9/1953 | Kernahan | 264/272 |
| 3,158,503 | 11/1964 | Young | 29/625 |
| 3,484,935 | 12/1969 | Burns | 29/628 |
| 3,541,222 | 11/1970 | Parks et al. | 29/628 |
| 3,577,496 | 5/1971 | Hoffman | 264/156 |
| 3,680,037 | 7/1972 | Nellis et al. | 29/628 |
| 3,742,182 | 6/1973 | Saunders | 264/25 |
| 3,778,900 | 12/1973 | Haining et al. | 29/628 |

*Primary Examiner*—Jeffery R. Thurlow
*Attorney, Agent, or Firm*—Donnelly, Maky, Renner & Otto

[57] ABSTRACT

A method for making a multi-conductor element includes forming a plurality of holes in an elastomeric base using a laser or mechanical technique to perforate the base and filling each of the holes with a slurry of conductive material in an uncured liquid vehicle. The filling step may be accomplished either by the force of a roller press while the slurry is applied or by stretching the base to expand the holes after which the slurry is applied to the latter followed by release of the base after the vehicle has cured, and in either case the ends of the conductive portions in the holes will bulge slightly above the surfaces of the base. An article manufactured using the method has a capacity or conductive density of at least approximately 11,500 conductive portions per square inch of base.

3 Claims, 2 Drawing Figures

MULTI-CONDUCTOR ELEMENT AND METHOD OF MAKING SAME

This invention relates to an improved anisotropic conductor in the form of a board, strip or other flat or substantially flat shape, of dielectric material having a multiplicity of electrically conductive members in discrete configuration extending transversely through such a base element for longitudinal current flow through the members.

The simplest example of an assembly using such a conductor is as an interconnection between the surface terminals of two printed circuit boards between which the conductor is sandwiched with its conductive elements forming lateral interconnections of selected terminals of the respective circuit boards.

An electrical interconnector with this general description is shown in U.S. Pat. No. 3,680,037, dated July 25, 1972, and takes us one step further in that resiliency of the base element carrying the interposed conductors and/or of such conductors is considered a factor. The patentees teach, for example, the use of a resilient retainer with the conductors carried thereby either rigid or resilient, and in general terms, an effort is made to set forth all possible combinations of the retainer and conductors in terms of resiliency. The same blanket approach is taken with regard to the form of the conductors at their ends at respective sides of the retainer, such as, concave, co-terminal, or convex in relation to such retainer sides or surfaces. Other examples of ambivalence exist, but only one method of production is disclosed and that comprises preforming resilient conductors in partially cured state, arranging them in desired spatial array, flowing uncured resin about the conductors, and subsequently curing the retainer and, inherently since not explained, completing curing of the conductors.

One skilled in the art is thus given by the patent numerous permutations and combinations with regard to resiliency and/or shaping of the finished product, but only one method for producing the same. The present invention, in contrast, is directed to use of a preformed elastomeric or resilient base and transverse conductors therethrough of resilient electrically conductive material definitely having end protrusions or bulges at the respective flat faces of the base.

Another object of the present invention is to not only preform the base or retainer element, but to form the holes through the same to receive the transverse conductors in a very precise manner and thereby allow extremely high conductor density.

Another object is to provide a method of manufacturing such a multi-element conductor in which the conductive elements are inserted in the preformed base or retainer in such manner as to assure laterally compressive force on each holding all normally under essentially radial pressure, thereby to assure the conductive element protrusions at the faces of the retainer and the compression thereof throughout the above-indicated and other comparable useful applications of the conductor.

Figure 2:
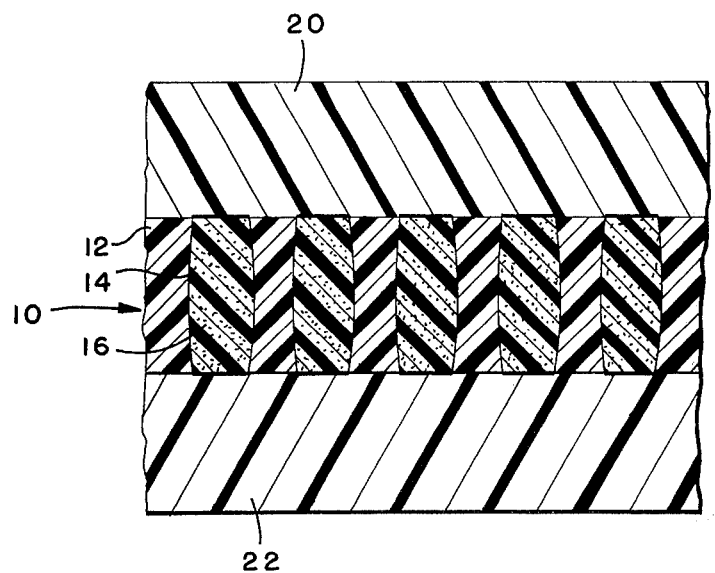

FIG. 1 shows in vertical section a portion of a conductor made in accordance with the present invention; and FIG. 2 illustrates in like section the multi-conductor element positioned between two rigid dielectric printed circuit or other contact elements.

Referring now in more detail to the drawing, as indicated by the legend applied thereto, the product of the invention comprises an interconnector 10 made up of an elastomeric base material 12 in the form of a relatively thin elastomeric sheet made, for example, of natural or synthetic non-conductive rubber or other resilient electrically non-conductive material.

The elastomeric retainer or base 12 is cured and has in its pre-use finished form, a series of parallel holes 14 extending from one flat surface to the other. In these holes are lengths or rods 16 of resilient electrically conductive material 18, with each such conductor having slight convex bulges 19 or protrusions at its respective ends thus at both sides of the base 12. The density of conducting material 18 in the rods 16 may be sufficient to make the latter electrically conductive by itself or that density may be such as to require compression of the rods to effect relatively unimpeded electrical conduction, but in either case the rods will be referred to herein as conductors. These are the anisotropic conductive elements that provide for current passage transversely of the base sheet, but not parallel to the surfaces of the latter. In use, the conductor member thus far described is interposed between flat contact bearing members 20 and 22 at their inner faces, clamped or held in any suitable fashion against the faces of the conductor element 10, and it will be understood that such inner faces of these outer members 20 and 22 will, for example, carry printed circuits and contacts indiscernible in the scale of the drawing in any preselected design or spatial array relative to the conductors 16 for desired interconnection through the latter. The board 20 and 22 shown are illustrative only since they could as well be flat cables, DIPs, flatpacks, read-out devices, and the like, and it will be appreciated by those in the art that the three element assembly shown can be made to grow at one or both sides by repetition of the base assembly illustrated, that is, with added conductors according to the invention and further contact boards or the like overlying the same according to the circuit geometry desired.

Extremely high conductor density is one of the desiderata of the invention and this can be realized in a number of ways.

For example, the thin elastomeric base or retainer is first formed and the pattern of the holes desired therein is formed by employing a laser, with conventional lasers well-known and having the capacity of burning a ten microinch diameter hole with extreme accuracy in currently available techniques. In this case, the preformed retainer or base can then receive the conductor elements by applying to a surface a resilient adhesive slurry containing a metallic powder, such as silver, copper, or gold, with an example of such a vehicle being the silicone elastomer available from Technical Wire Products, Inc., Cranford, N.J., under the trademark "CONSIL". The conductive or metallic powder as first mentioned is mixed with the uncured liquid vehicle in adequate quantity for the finished element to be conductive as aforesaid to form the slurry, and the latter is then forced under pressure into the laser-made perforations in the base material, for example, by use of a roller press or the equivalent, so that the operation leaves the slight end bulging as illustrated of the resilient conductive elements at the respective sides of the base material.

Another method of producing this conductor of resilient base material and resilient protruding conductors would be to again prepare the thin perforated base sheet as aforesaid, cutting the same to provide pieces of a workable size, and stretching each cut piece over a frame to open up the perforations for acceptance of the above slurry applied in the same manner. After curing the slurry and removal of the base from its frame it contracts to near its original size and, in this manner, creates the desired end protrusion of the individual conductors.

With either method, or an equivalent of the same, the noted end protrusion is obviously guaranteed and, accordingly, when a through conductor element is clamped between the terminal carrying pieces at the sides, there will be some lateral forcible expansion of the individual conductors indicated in FIG. 2, whereby the end engagements with the contacts at their respective sides are definitely and reliably under pressure. Moreover, in either method a mechanical perforating machine may be used as a substitute in place of the described laser perforating technique.

It will be understood by a worker skilled in the art that other variations of manufacture can be employed while working preferably with a preformed cured or partially cured perforated elastomeric base and subsequent addition thereto of likewise resilient electro-conductive elements to produce the type of conductor shown in FIG. 1.

The use of the laser to form the perforations is quite desirable and, as an illustration only, the preformed base material may have a thickness of 0.015 inch, with the individual conductors having a normal or uncompressed diameter of 0.005 inch and the centers of the conductors at a spacing of approximately 0.010 inch or less. The contact or conductor density of such an element therefore may be on the order of 11,500 conductors per square inch, which is believed to be considerably higher than any comparable interconnector presently available. Moreover, it is contemplated that with the development of more sophisticated techniques for perforating the base material at even more closely spaced positions, a conductor density of 50,000 or more conductors per square inch may be achieved.

The embodiments of the invention in which an exclusive property or privilege is claimed are defined as follows:

1. The method of producing a multi-conductor element, which comprises the steps of forming a plurality of holes through a board made of a resiliently deformable and electrically insulative material, resiliently deforming the board to diametrically enlarge the holes in the same, filling the thus enlarged holes with a slurry of electrically conductive material in an uncured flowable vehicle that is resilient when cured, curing the vehicle in the enlarged holes, and then releasing the board from deformation for return of the holes to normal diameter, such relative constriction of the holes applying sufficient radial force on the cured resilient conductors therein as to cause the latter to bulge outwardly beyond the surfaces of the board.

2. The method as set forth in claim 1, wherein the resilient deformation of the board is accomplished by stretching the same.

3. The method of producing a multi-conductor element, which comprises the steps of forming a plurality of holes through a board made of a resiliently deformable and electrically insulative material, resiliently deforming the board to enlarge the holes in the same by filling the holes under pressure with a slurry of electrically conductive material in an uncured flowable vehicle that is resilient when cured, curing the vehicle in the enlarged holes, and then releasing the board from deformation for return of the holes to normal diameter, such relative constriction of the holes applying sufficient radial force on the cured resilient conductors therein as to cause the latter to bulge outwardly beyond the surfaces of the board.

* * * * *